US012520437B2

(12) United States Patent
Fu et al.

(10) Patent No.: US 12,520,437 B2
(45) Date of Patent: Jan. 6, 2026

(54) WEARING MEMBERS, WEARING DEVICES, AND CHARGING SYSTEMS

(71) Applicant: SHENZHEN SHOKZ CO., LTD., Guangdong (CN)

(72) Inventors: Xin Fu, Shenzhen (CN); Peipei Lin, Shenzhen (CN); Zhiqing Liu, Shenzhen (CN); Xin Xiao, Shenzhen (CN); Gong Yue, Shenzhen (CN); Zhen Wang, Shenzhen (CN); Sunjie Huang, Shenzhen (CN)

(73) Assignee: SHENZHEN SHOKZ CO., LTD., Shenzhen (CN)

(*) Notice: Subject to any disclaimer, the term of this patent is extended or adjusted under 35 U.S.C. 154(b) by 263 days.

(21) Appl. No.: 18/365,975

(22) Filed: Aug. 5, 2023

(65) Prior Publication Data

US 2023/0380081 A1 Nov. 23, 2023

Related U.S. Application Data

(63) Continuation of application No. PCT/CN2022/139084, filed on Dec. 14, 2022.

(30) Foreign Application Priority Data

Jan. 27, 2022 (CN) .......................... 202220233925.0
Jan. 27, 2022 (CN) .......................... 202220234875.8
(Continued)

(51) Int. Cl.
*H05K 5/00* (2025.01)
*G02C 11/00* (2006.01)
(Continued)

(52) U.S. Cl.
CPC ........... *H05K 5/0086* (2013.01); *G02C 11/10* (2013.01); *H01F 7/0205* (2013.01); *H04R 1/028* (2013.01);
(Continued)

(58) Field of Classification Search
CPC .. H05K 5/0086; H05K 5/0217; H05K 7/1427; G02C 11/10; H01F 7/0205;
(Continued)

(56) References Cited

U.S. PATENT DOCUMENTS 10,950,217 B1 3/2021 Dong et al.
2015/0319546 A1 11/2015 Sprague
(Continued)

FOREIGN PATENT DOCUMENTS

CN 203720476 U 7/2014
CN 106226920 A 12/2016
(Continued)

OTHER PUBLICATIONS

Partial Supplementary European Search Report in European Application No. 22923532.0 mailed on Aug. 28, 2024, 11 pages.
(Continued)

*Primary Examiner* — Andrew Sniezek
(74) *Attorney, Agent, or Firm* — METIS IP LLC

(57) ABSTRACT

The present disclosure discloses a wearing member, a wearable device, and a charging system. The wearing member includes a housing and one or more electronic devices. The housing includes a first connection section and a concave section. The concave section is connected to one end of the first connection section, and the concave section forms a downward hollow in a wearing state. At least a portion of the one or more electronic devices are disposed in the concave section. Through the above manner, the wearing member disclosed in the present disclosure can utilize an installation
(Continued)

space therein fully, optimizing a layout of the one or more electronic devices, which minimizes the wearing member and improves the utilization rate of the space.

19 Claims, 6 Drawing Sheets

(30) Foreign Application Priority Data

| Jan. 27, 2022 | (CN) | ............... 202220234921.4 |
| Jan. 27, 2022 | (CN) | ............... 202220235575.1 |
| Jan. 27, 2022 | (CN) | ............... 202220235624.1 |

(51) Int. Cl.
| *H01F 7/02* | (2006.01) |
| *H04R 1/02* | (2006.01) |
| *H04R 1/28* | (2006.01) |
| *H04R 3/00* | (2006.01) |
| *H05K 5/02* | (2006.01) |
| *H05K 7/14* | (2006.01) |

(52) U.S. Cl.
CPC ............. *H04R 1/2884* (2013.01); *H04R 3/00* (2013.01); *H05K 5/0217* (2013.01); *H05K 7/1427* (2013.01); *H04R 2410/07* (2013.01)

(58) Field of Classification Search
CPC ........ H04R 1/028; H04R 1/2884; H04R 3/00; H04R 2410/07
See application file for complete search history.

(56) References Cited

U.S. PATENT DOCUMENTS

| 2016/0370606 A1 | 12/2016 | Huynh |
| 2019/0052954 A1 | 2/2019 | Rusconi Clerici Beltrami et al. |
| 2021/0159637 A1 | 5/2021 | Youn |
| 2021/0211795 A1 | 7/2021 | Wang et al. |
| 2021/0240007 A1* | 8/2021 | Hicks ....................... H04R 1/08 |

FOREIGN PATENT DOCUMENTS

| CN | 111562676 A | 8/2020 |
| CN | 113242489 A | 8/2021 |
| CN | 214704204 U | 11/2021 |
| CN | 217386000 U | 9/2022 |
| CN | 217386001 U | 9/2022 |
| CN | 217386002 U | 9/2022 |
| CN | 217386003 U | 9/2022 |
| CN | 217642756 U | 10/2022 |
| EP | 1971894 B1 | 8/2015 |
| JP | 2006139113 A | 6/2006 |
| JP | 3229497 U | 12/2020 |

OTHER PUBLICATIONS

Notice of Rejection in Japanese Application No. 2023-557216 mailed on Sep. 3, 2024, 11 pages.
International Search Report in PCT/CN2022/139084 mailed on Feb. 20, 2023, 8 pages.
Notice of Preliminary Rejection in Korean Application No. 10-2023-7032767 mailed on May 9, 2025, 21 pages.

* cited by examiner

WEARING MEMBERS, WEARING DEVICES, AND CHARGING SYSTEMS

CROSS-REFERENCE TO RELATED APPLICATIONS

This application is a continuation of International Application No. PCT/CN2022/139084, filed on Dec. 14, 2022, which claims priority of the Chinese Patent Applications No. 202220234875.8, No. 202220235575.1, No. 202220234921.4, and No. 202220235624.1, filed on Jan. 27, 2022, all entitled "WEARABLE DEVICES AND WEARABLE MEMBERS THEREOF," and priority of the Chinese Patent Application No. 202220233925.0, filed on Jan. 27, 2022, entitled "CHARGERS AND CHARGING SYSTEMS," the entire contents of each of which are hereby incorporated by reference.

TECHNICAL FIELD

The present disclosure relates to the technical field of wearable devices, and in particular, to wearing members, wearable devices, and charging systems.

BACKGROUND

After the first release of Google Glass by Google in 2012, the concepts of wearable devices such as smart glasses have become familiar to the public. Nowadays, relatively mature wearable devices include smart watches, VR/AR head displays, smart glasses, etc.

The shape of the smart glasses is similar to the shape of common glasses such as myopia glasses or sunglasses, which determines that the space in the smart glasses for installing various electronic devices is extremely limited.

SUMMARY

The present disclosure provides a wearing member, a wearable device, and a charging system, so as to solve a problem that the space in smart glasses for installing electronic devices is insufficient.

In order to solve the technical problem, a technical solution adopted by the present disclosure is to provide a wearing member. The wearing member includes a housing and one or more electronic devices. The housing includes a first connection section and a concave section. The concave section is connected to one end of the first connection section, wherein the concave section forms a downward hollow in a wearing state. At least a portion of the one or more electronic devices are disposed in the concave section.

In some embodiments, the concave section includes a first bending portion and a second bending portion. Top walls of the first bending portion and the second bending portion form the downward hollow in the wearing state, and the first connection section are connected to the first bending portion. The one or more electronic devices include a circuit board, the circuit board includes a first hard board, and the first hard board is disposed in the first bending portion to form an anti-bending support with the first bending portion.

In some embodiments, the first hard board has a main surface. The main surface is disposed opposite to a side wall of the first bending portion, and at least one side edge on the first hard board adjacent to the main surface abut against the top wall or a bottom wall of the first bending portion.

In some embodiments, two side edges of the first hard board adjacent to the main surface abut against the top wall and the bottom wall of the first bending portion, respectively.

In some embodiments, the first hard board is configured to enhance an anti-bending strength of the first bending portion by at least 20%.

In some embodiments, the wearing member further includes a controller. The controller is disposed in the first bending portion and mounted on the main surface, and the controller and the first hard board abut against a first side wall and a second side wall of the first bending portion, respectively.

In some embodiments, the wearing member further includes a battery and a speaker. The speaker is disposed in the second bending portion to form an anti-bending support to the second bending portion. The battery is disposed in the first connection section to form an anti-bending support to the first connection section. Both the battery and the speaker are electrically connected to the first hard board.

In some embodiments, a sound pickup hole is disposed at a bottom portion of the downward hollow, and the wearing member further includes a noise-reducing member and a sound pickup member. The noise-reducing member is disposed in the first bending portion, one end of a noise-reducing channel of the noise-reducing member is in communication with the sound pickup hole, and another end of the noise-reducing channel is in communication with the sound pickup member. The noise-reducing member is located between the speaker and the first hard board, and two ends of the noise-reducing member abut against the top wall and a bottom wall of the first bending portion, respectively.

In some embodiments, the second bending portion further includes a positioning wall, and the positioning wall is located between the speaker and the noise-reducing member to limit a location of the noise-reducing member.

In some embodiments, the housing further includes a second connection section connected to the second bending portion. Each of the first connection section and the second connection section extend to a side apart from each other. The wearing member further includes a flexible cover. The flexible cover is sleeved on the second connection section. The second connection section gradually bends along an extending direction of the second connection section, such that the second connection section is clamped to a user's head in the wearing state.

In some embodiments, the housing further includes a second connection section. The first connection section and the second connection section are connected to opposite sides of the concave section, respectively. The one or more electronic devices include a speaker. The speaker is disposed in the concave section. The wearing member further includes a battery. The battery is disposed in the first connection section and configured to supply power to the speaker. One end of the first connection section far away from the second connection section is configured to connect to a visual member. The visual member is configured to be worn on a nose bridge, and the second connection section is configured to be worn on an auricle. In some embodiments, the concave section includes a first bending portion and a second bending portion connected through a bending connection. Top walls of the the first bending portion and the second bending portion cooperate with each other to enclose the downward hollow, the first connection section is connected to one end of the first bending portion away from the second bending portion, and the second connection section is connected to one end of the second bending portion away from the first bending portion. The speaker is disposed in the second bending portion.

In some embodiments, the wearing member further includes a controller. The controller is disposed in the first bending portion, and the controller is electrically connected to the battery and the speaker.

In some embodiments, the wearing member further includes a circuit board. The circuit board is disposed in the first connection section and the concave section, and the speaker, the battery, and the controller are electrically connected to the circuit board.

In some embodiments, the wearing member further includes a pressing member and an indicating member. The pressing member is disposed in the first connection section and electrically connected to the circuit board, the indicating member is disposed in the concave section and electrically connected to the circuit board, the indicating member being configured to feedback operation information of the pressing member, and the battery is located between the pressing member and the indicating member.

In some embodiments, the circuit board includes a first hard board, a second hard board, and a first flexible board connected between the first hard board and the second hard board. The first hard board is disposed in the first bending portion, the controller is electrically connected to the first hard board and is stacked in layers with the first hard board, the first flexible board is disposed in the first connection section, the battery is stacked in layers with the first flexible board, and the second hard board is disposed at one end of the battery away from the first bending portion. Both the indicating member and the battery are directly electrically connected to the first hard board, and the pressing member is electrically connected to the second hard board.

In some embodiments, the first hard board also forms an anti-bending support with the top wall and a bottom wall of the first bending portion.

In some embodiments, the circuit board further includes a second flexible board, the second flexible board is connected to one side of the first hard board far away from the first flexible board, and the second flexible board is disposed in the second bending portion, wherein the speaker is electrically connected to the second flexible board and is stacked in layers with the second flexible board.

In some embodiments, the circuit board further includes a third hard board and a third flexible board, the third hard board is connected to one side of the second flexible board away from the first hard board, and the third flexible board is connected to one side of the second flexible board and disposed to bend relative to the second flexible board. The wearing member further includes a first sound pickup member and a second sound pickup member, wherein the first sound pickup member is disposed in the first bending portion and electrically connected to the third flexible board, and the second sound pickup member is disposed in the second bending portion and electrically connected to the third hard board.

In some embodiments, the wearing member further comprises a circuit board, a pressing member, a battery, and the one or more electronic devices. The circuit board is disposed inside the housing. The pressing member is disposed on the first connection section and electrically connected to the circuit board. The battery is disposed in the first connection section and electrically connected to the circuit board. The one or more electronic devices include an indicating member, wherein the indicating member is disposed in the concave section and electrically connected to the circuit board, and the battery is located between the pressing member and the indicating member.

In some embodiments, the concave section includes a first bending portion and a second bending portion connected through a bending connection, top walls of the first bending portion and the second bending portion cooperating with each other to form the downward hollow, and the indicating member being disposed on a bottom wall of the first bending portion opposite to the top wall. The housing also includes a second connection section, the first connection section is connected to one end of the first bending portion away from the second bending portion, the second connection section is connected to one end of the second bending portion away from the first bending portion, and the second connection section is configured to be worn on a user's auricle. In some embodiments, the circuit board includes a first hard board, a second hard board, and a first flexible board disposed between the first hard board and the second hard board, wherein the first hard board is disposed in the first bending portion, the first flexible board is disposed in the first connection section, the battery is stacked in layers with the first flexible board, and the second hard board is disposed at one end of the battery away from the first bending portion. Both the indicating member and the battery are electrically connected to the first hard board, and the pressing member is electrically connected to the second hard board.

In some embodiments, a main surface of the second hard board stacks with an end surface of the battery.

In some embodiments, the wearing member further includes a controller, the controller is disposed in the first bending portion, electrically connected to the first hard board, and stacked in layers with the first hard board.

In some embodiments, the circuit board further includes a second flexible board. The second flexible board are connected to one side of the first hard board away from the first flexible board and disposed in the second bending portion. The wearing member further includes a speaker. The speaker is disposed in the second bending portion, electrically connected to the second flexible board, and stacked in layers with the second flexible board. A stacking direction of the controller and the first hard board is the same as a stacking direction of the speaker and the second flexible board.

In some embodiments, the circuit board further includes a third flexible board. The third flexible board is connected to one side of the second flexible board and disposed to bend relative to the second flexible board. The wearing member further includes a first sound pickup member. The first sound pickup member is electrically connected to the third flexible board and stacked in layers with the third flexible board, and the first sound pickup member is located between the controller and the speaker.

In some embodiments, the circuit board further includes a third hard board. The third hard board is located in the second bending portion and connected to one end of the second flexible board away from the first hard board. The wearing member further includes a second sound pickup member. The second sound pickup member is electrically connected to the third hard board and stacked in layers with the third hard board, and the second sound pickup member is misaligned with the speaker.

In some embodiments, the circuit board further includes the third hard board, the third hard board being located in the second bending portion, and the third hard board being connected to an end of the second flexible board away from the first hard board. A charging member is also disposed in the third hard board. The charging member is configured to charge the battery.

In some embodiments, the housing further includes a second connection section. The first connection section and the second connection section are connected to both ends of the concave section, respectively, and extend in opposite directions. The one or more electronic devices include a charging member, and the wearing member further includes at least one magnetic attachment member, wherein the charging member and the at least one magnetic attachment member are located on a connection region between the second connection section and the concave section, and the at least one magnetic attachment member is configured to magnetically attach a charger that supplies power to the charging member.

In some embodiments, the at least one magnetic attachment member of the wearing member includes at least two magnetic attachment members, and directions of magnetic poles of the at least two magnetic attachment members are opposite to each other.

In some embodiments, the concave section includes a first bending portion and a second bending portion. Top walls of the first bending portion and the second bending portion form the downward hollow in a wearing state. The first connection section is connected to the first bending portion and extending to a side away from the second bending portion, and the second connection section is connected to the second bending portion and extends to a side away from the first bending portion. The wearing member further includes a speaker. The speaker is disposed in the second bending portion, and the charging member and the one or more magnetic attachment members are located between an outer side wall of the speaker and the top wall of the second bending portion.

In some embodiments, the speaker includes a first long-side wall, a first short-side wall, a second long-side wall, and a second short-side wall that are connected in a rectangular shape, and the top wall includes a first top surface, a second top surface, and a third top surface that are sequentially connected through a bending connection. The first top surface is located on the first bending portion, the second top surface is located on the second bending portion, and the first top surface and the second top surface cooperate with each other to form the downward hollow. The first long-side wall is adjacent to the second top surface, the first short-side wall is adjacent to the third top surface, and at least a portion of the charging member and the one or more magnetic attachment members are located in a region defined by the second top surface, the third top surface, and the first short-side wall.

In some embodiments, a portion of the charging member and the one or more magnetic attachment members are located on one side of the second long-side wall away from the first long-side wall.

In some embodiments, the second top surface and the third top surface connected through the bending connection form a corner structure, and the corner structure is configured to position the charger.

In some embodiments, each of the one or more magnetic attachment members includes a first magnet and a second magnet, and the charging member includes a first charging electrode and a second charging electrode. The first charging electrode, the first magnet, and the speaker are distributed along the second top surface, and the first charging electrode, the first magnet, the second charging electrode, and the second magnet are further distributed along the third top surface.

In some embodiments, the first charging electrode is located in a region defined by the second top surface, the third top surface, and the first magnet, and the second charging electrode is located in a region defined by the first magnet, the second magnet, the speaker, and the third top surface.

In some embodiments, a resonant chamber is formed between the speaker and a first side wall of the second bending portion, a sound-out hole in communication with the resonant chamber is disposed in the second bending portion, a muffling hole is disposed on a second side wall of the second bending portion, the speaker is attached to the second side wall to cover the muffling hole, and the muffling hole cooperates with the sound-out hole to form a dipole.

The present disclosure also provides a wearing member. The wearable device includes a visual member and a wearing member as described in the present disclosure, and the wearing member is connected to the visual member.

The present disclosure further provides a charging system. The charging system includes a charger and a wearable device as described in the present disclosure. The wearing member of the wearable device includes one or more magnetic attachment members. The charger includes at least one seat body, at least one limiting member, and at least one magnetic member. The at least one seat body is disposed with a joining surface. The at least one limiting member is disposed on the at least one seat body. The at least one magnetic member is disposed on the at least one seat body and configured to magnetically attach to the one or more magnetic attachment members of the wearing member. A magnetic attachment force between the at least one magnetic member and each of the one or more magnetic attachment members has a first component that enables the wearing member to adhere to the joining surface and a second component that enables the wearing member and the at least one limiting member have a position limiting relationship, wherein the one or more magnetic attachment members are magnetically attached to the at least one magnetic member, so that the joining surface adheres to the wearing member, and the wearing member and the at least one limiting member have the position limiting relationship.

In some embodiments, the at least one limiting member is a blocking wall in a semi-enclosed structure, and the second component is configured to abut the wearing member against the blocking wall.

In some embodiments, the blocking wall has a stop surface perpendicular to the joining surface, and the second component is configured to abut the wearing member against the stop surface.

In some embodiments, the blocking wall includes a first sub-wall and a second sub-wall disposed at an angle, and the first sub-wall and the second sub-wall are configured to cooperate with the corner structure of the wearing member.

In some embodiments, the at least one magnetic member of the charger includes at least two magnetic members, and magnetic pole directions of the at least two magnetic members are opposite to each other.

In some embodiments, the at least one seat body includes a main body portion, a cover body portion, a power connection member, and a power supply board. The at least one magnetic member and the power supply board are stacked in layers with each other and are located in an accommodation space formed by interlocking the cover body on the main body. The power connection member is electrically connected to the power supply board and exposed from a mounting hole on the main body.

In some embodiments, the at least one seat body includes a clamping wall, and the clamping wall cooperates with the at least one limiting member to form a clamping interface for clamping the wearing member.

In some embodiments, the at least one limiting member is a protrusion or a groove disposed on the joining surface of the at least one seat body, and the protrusion or the groove is configured to position the wearing member.

In some embodiments, the charger further includes a power connector, and the at least one seat body of the charger includes two seat bodies, wherein each of the two seat bodies includes a limiting member and a corresponding magnetic member, and the power connector is electrically connected to the two seat bodies through a wire.

The present disclosure discloses a wearing member, a wearable device, and a charging system. The housing of the wearing member includes the first connection section and the concave section, the concave section forms the downward hollow, and at least a portion of the one or more electronic devices are disposed in the concave section. In this way, the one or more electronic devices can be installed in the concave section, further making full use of an installation space in the wearing member and optimizing a layout of the one or more electronic devices, which minimizes the wearing member and improves the utilization rate of space.

BRIEF DESCRIPTION OF THE DRAWINGS

In order to more clearly illustrate the technical solutions in the embodiments of the present disclosure or the prior art, the following will briefly introduce the drawings that need to be used in the description of the embodiments or the prior art. Obviously, the accompanying drawings in the following description are merely some embodiments of the present disclosure. For those of ordinary skill in the art, other drawings may also be obtained according to these drawings without creative work, wherein.

DETAILED DESCRIPTION

The following will clearly and completely describe the technical solutions in the embodiments of the present disclosure with reference to the accompanying drawings in the embodiments of the present disclosure. Obviously, the described embodiments are only a part of the embodiments of the present disclosure, and not all of them. Based on the embodiments of the present disclosure, all other embodiments obtained by persons of ordinary skill in the art without making creative efforts belong to the scope of protection of the present disclosure.

The terms "first," "second," and "third" in the embodiments of the present disclosure are used for descriptive purposes only, and cannot be understood as indicating or implying relative importance or implicitly indicating a quantity of indicated technical features. Thus, features defined as "first," "second," and "third" may explicitly or implicitly include at least one of these features. In the description of the present disclosure, the term "plurality" means at least two, such as two, three, etc., unless otherwise specifically defined. Furthermore, the terms "include" and "have," as well as any variations thereof, are intended to cover a non-exclusive inclusion. For example, a process, method, system, product, or device comprising a series of steps or units is not limited to the listed steps or units, but optionally also includes unlisted steps or units, or optionally further includes other steps or units inherent in these processes, methods, products or devices.

Reference herein to the term "embodiment" means that a particular feature, structure, or characteristic described in connection with the embodiment can be included in at least one embodiment of the present disclosure. The occurrences of the term in various places in the present disclosure are not necessarily all referring to the same embodiment, nor are separate or alternative embodiments mutually exclusive of other embodiments. It is understood explicitly and implicitly by those skilled in the art that the embodiments described herein can be combined with other embodiments.

Figure 1:
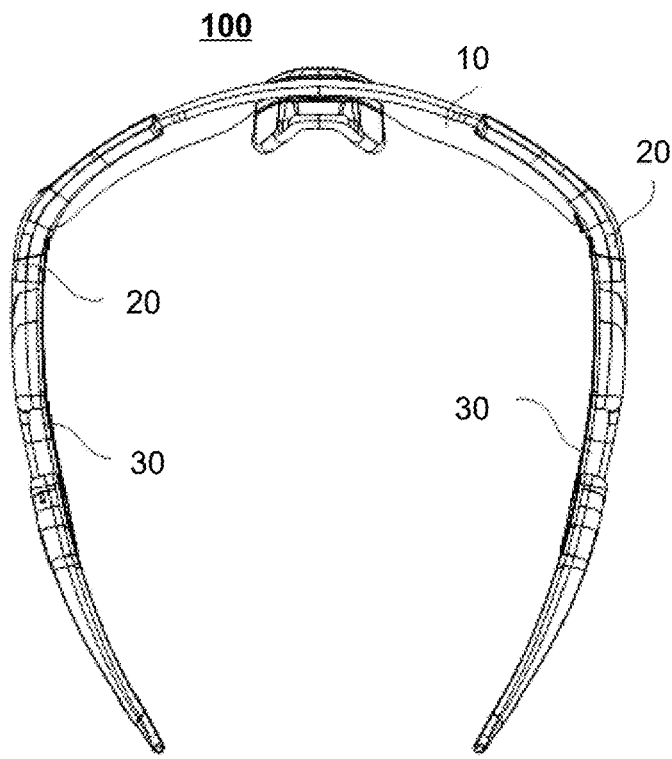
FIG. 1 is a schematic diagram illustrating an exemplary structure of a wearable device according to some embodiments of the present disclosure.
Figure 2:
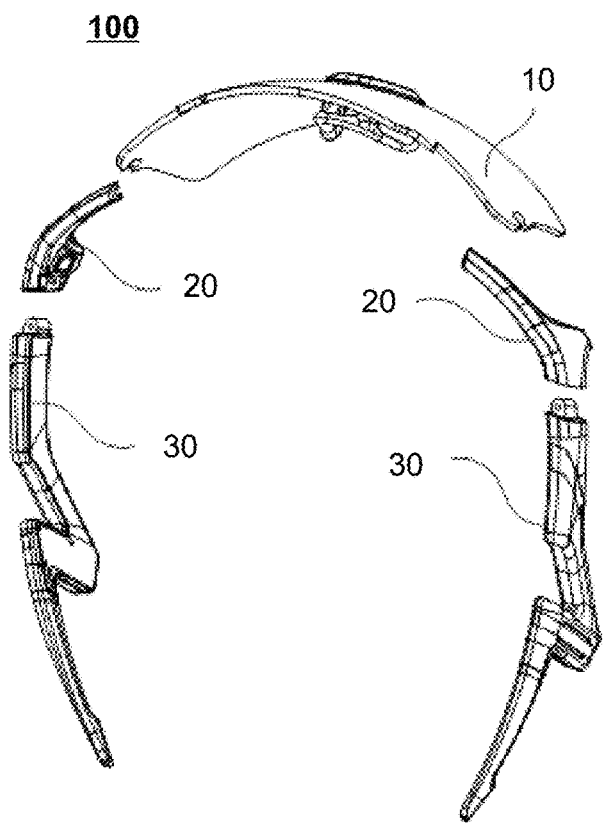
FIG. 2 is a schematic diagram illustrating an exemplary decomposed structure of the wearable device shown in FIG. 1.

The present disclosure provides a wearable device 100. Referring to FIG. 1 and FIG. 2 together, FIG. 1 is a schematic diagram illustrating an exemplary structure of the wearable device according to some embodiments of the present disclosure, and FIG. 2 is a schematic diagram illustrating an exemplary discomposed structure of the wearable device shown in FIG. 1.

The wearable device 100 may include a pair of glasses, a smart bracelet, an earphone, a hearing aid, a smart helmet, a smart watch, smart clothing, a smart backpack, a smart accessory, or the like, or any combination thereof. For example, the wearable device 100 may be a pair of functional myopia glasses, a pair of presbyopic glasses, a pair of cycling glasses, a pair of sunglasses, etc. Alternatively, the wearable device 100 may be a pair of smart glasses, such as a pair of audio glasses with an earphone function. The wearable device 100 may also be a headset device such as a helmet, an augmented reality (AR) device, a virtual reality (VR) device, etc.

In some embodiments, the augmented reality device or the virtual reality device may include a virtual reality helmet, a pair of virtual reality glasses, an augmented reality helmet, a pair of augmented reality glasses, or the like, or any combination thereof. For example, the virtual reality device and/or the augmented reality device may include Google Glass, Oculus Rift, Hololens, Gear VR, etc.

The wearable device 100 includes a visual member 10, two quick disassembly components 20, and two wearing members 30. The visual member 10 and the wearing members 30 are connected to two ends of the quick disassembly components 20, respectively, and the visual member 10 and the wearing members 30 may be quickly disassembled from the quick disassembly components 20. The wearing members 30 may further be set with the quick disassembly components 20 as a conventional connection structure or an integrated structure.

In this embodiment, the wearable device 100 is a headset device. The visual member 10 may be a lens, a display screen, or a display screen with a lens function. The visual member 10 may also be a lens and an auxiliary part thereof or a display screen and an auxiliary part thereof. The auxiliary part may be a mirror frame or a frame, etc., so that the visual member 10 and the quick disassembly components 20 are connected with each other.

In some embodiments, the visual member 10 may also be a dial structure with a display function.

In this embodiment, the wearable device 100 may be a pair of glasses, the visual member 10 may be a lens, and the wearing member 30 may be a temple. The wearable device 100 may include the visual member 10, two sets of quick disassembly components 20, and two sets of wearing members 30. The two sets of quick disassembly components 20 may be disposed at both ends of the visual member 10, and the two sets of wearing members 30 may be connected to a corresponding set of quick disassembly component 20, respectively.

In some embodiments, the wearing member 30 may also be a headband or a watch strap, etc. Two ends of the wearing member 30 may be connected to the corresponding set of quick disassembly component 20, respectively. One end of the wearing member 30 may also be connected to a set of quick disassembly component 20, and another end of the wearing member 30 may be directly connected to the visual member 10.

In other embodiments, the wearable device 100 may further not include the quick disassembly components 20, and two ends of the visual member 10 may be connected to the wearing members 30.

In other words, the wearing member 30 may be directly connected to the visual member 10 or indirectly connected to the visual member 10 through the quick disassembly component 20.

Figure 3:
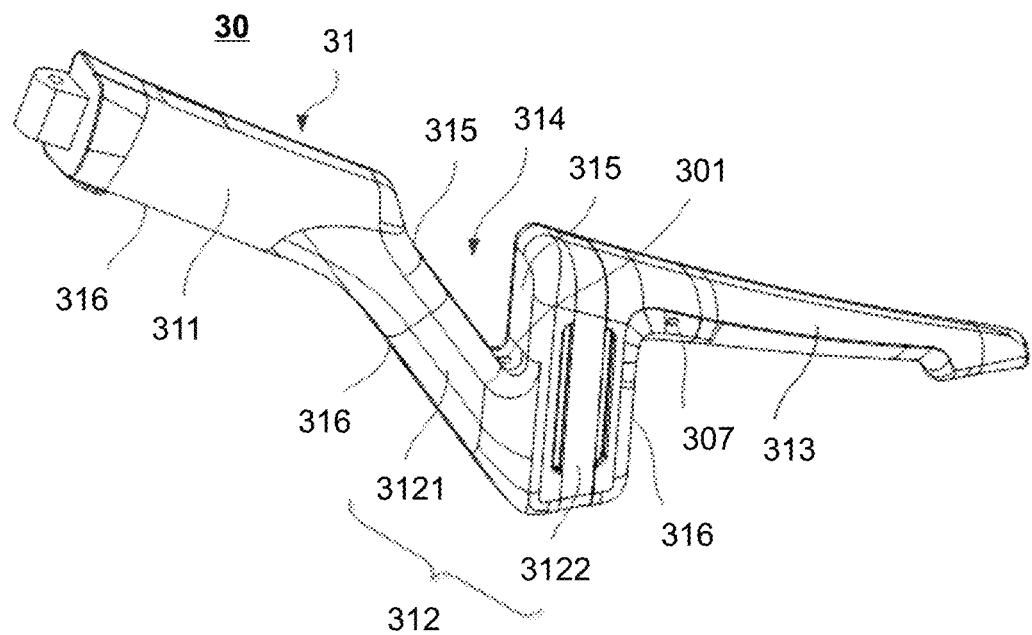
FIG. 3 is a schematic diagram illustrating an exemplary axial structure of a wearing member in the wearable device shown in FIG. 2.
Figure 4:
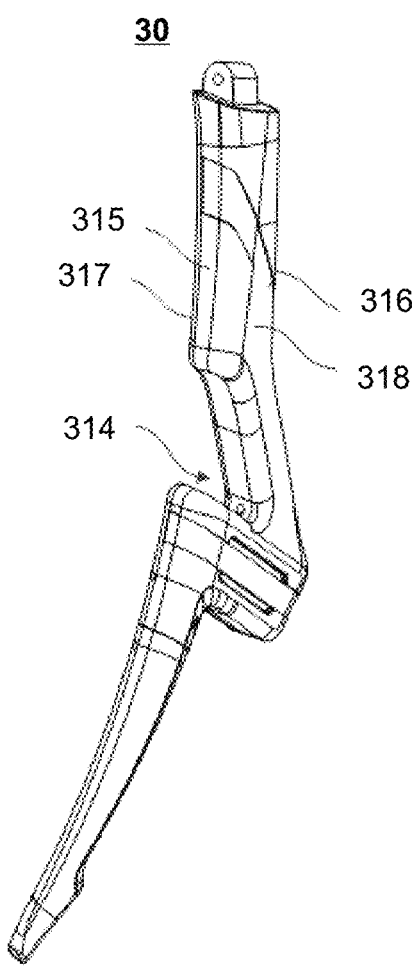
FIG. 4 is a schematic diagram illustrating another exemplary axial structure of the wearing member shown in FIG. 3.
Figure 5:
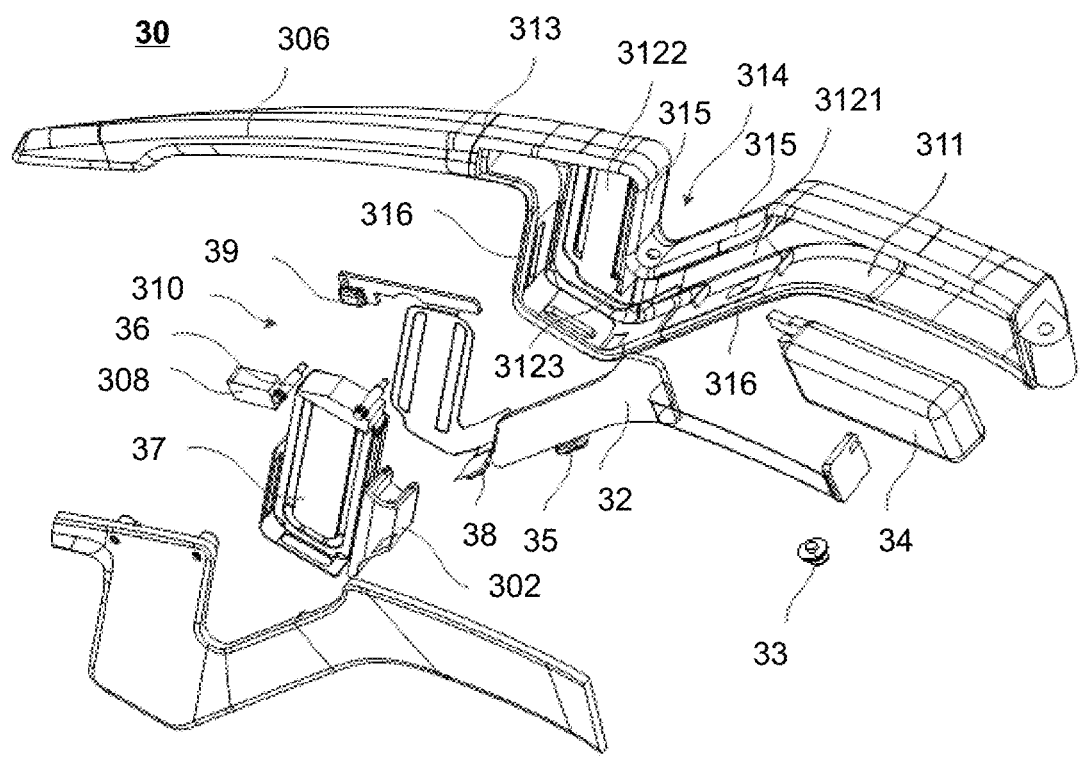
FIG. 5 is a schematic diagram illustrating an exemplary decomposed structure of the wearing member shown in FIG. 3.

Referring to FIG. 3 to FIG. 5 together, FIG. 3 is a schematic diagram illustrating an exemplary axial structure of a wearing member in the wearable device shown in FIG. 2, FIG. 4 is a schematic diagram illustrating another exemplary axial structure of the wearing member shown in FIG. 3, and FIG. 5 is a schematic diagram illustrating an exemplary decomposed structure of the wearing member shown in FIG. 3.

The wearing member 30 includes a housing 31 and one or more electronic devices 310. The housing 31 includes a first connection section 311 and a concave section 312. The concave section 312 is connected to one end of the first connection section 311. The concave section 312 forms a downward hollow 314 in a wearing state, and at least a portion of the one or more electronic devices 310 are disposed in concave section 312. The one or more electronic devices 310 includes a circuit board 32, an indicating member 35, a charging member 36, a speaker 37, a first sound pickup member 38, a second sound pickup member 39, or the like, or any combination thereof.

The wearing member 30 includes the housing 31, the circuit board 32, a pressing member 33, a battery 34, the indicating member 35, and the speaker 37. The circuit board 32 is disposed in the housing 31. The pressing member 33 is disposed on the first connection section 311 and is electrically connected to the circuit board 32. The battery 34 is disposed in the first connection section 311 and is electrically connected to the circuit board 32. The indicating member 35 is disposed in the concave section 312 and is electrically connected to the circuit board 32. The indicating member 35 is configured to feedback operation information of the pressing member 33. The battery 34 is located between the pressing member 33 and the indicating member 35. The speaker 37 is disposed in the concave section 312 and is electrically connected to the circuit board 32.

In some embodiments, the housing 31 further includes a second connection section 313. The first connection section 311, the concave section 312, and the second connection section 313 are sequentially connected. As used herein, one end of the first connection section 311 away from the concave section 312 is hinged to the quick disassembly component 20, the quick disassembly component 20 is connected to the visual member 10, the visual member 10 is configured to be worn on a nose bridge, and the second connection section 313 is configured to be worn on a user's auricle.

The wearable device 100 is a pair of smart glasses, wherein the visual member and the wearing members 30 on both sides of the user's head form a three-point support with the user's head. In the wearing state, by disposing heavy electronic devices such as the speaker 37, the battery 34, etc., between two supporting points of the nose bridge and the auricle, a wearing stability of the wearable device 100 can be increased, which can prevent weights at front and back ends of the wearable device 100 from being inconsistent.

Taking a scene where the user wears the wearable device 100 as an example, in the wearing state, the concave section 312 forms the downward hollow 314. That is, the concave section 312 extends toward an opening of an ear canal, so that a sound-out hole disposed on the concave section 312 may be close to the opening of the ear canal, which is conducive to transmitting a sound to the user.

In this embodiment, the concave section 312 includes a first bending portion 3121 and a second bending portion 3122 connected through a bending connection, and top walls 315 of the first bending portion 3121 and the second bending portion 3122 cooperate with each other to form the downward hollow 314. In other words, the downward hollow 314 is roughly a V-shape. The first connection section 311 is connected to one end of the first bending portion 3121 away from the second bending portion 3122, and the second connection section 313 is connected to one end of the second bending portion 3122 away from the first bending portion 3121.

The bending connection may be understood as that extension directions of the first bending portion 3121 and the second bending portion 3122 are different, or the first bending portion 3121 and the second bending portion 3122 are disposed at an included angle.

It should be noted that the top wall 315 of the first bending portion 3121 herein refers to a portion of the top wall 315 of the wearing member 30 located on the first bending portion 3121, and the top wall 315 of the second bending portion 3122 herein refers to a portion of the top wall 315 of the wearing member 30 located on the second bending portion 3122.

In this embodiment, the concave section 312 is roughly the V-shape. In some embodiments, the concave section 312 may also be a U-shape, a W-shape, etc., which is not specifically limited in the present disclosure.

The first connection section 311 and the concave section 312 are hollow sections, in which multiple electronic devices can be installed. The circuit board 32 is disposed in the first connection section 311 and the concave section 312 of the housing 31 to electrically connect the multiple electronic devices in the first connection section 311 and the concave section 312.

In some embodiments, the circuit board 32 may only be disposed in the concave section 312, and each of the multiple electronic devices in the first connection section 311 may be electrically connected to the circuit board 32 through a cable or a wire.

The pressing member 33 is configured to adjust functions of the wearable device 100, such as turning on and off the wearable device 100, adjusting a volume, playing, pausing, etc. For example, pressing the pressing member 33 once refers to increasing the volume, and pressing the pressing member 33 twice continuously refers to decreasing the volume.

The indicating member 35 may be an indicator light, and the indicator light flashes or displays different colors to represent the operation information triggered by the pressing member 33.

The indicating member 35 may also be a vibrating member, and the vibrating member represents the operation information triggered by the pressing member 33 through a duration of vibration or an intensity of the vibration.

The indicating member 35 is disposed on a bottom wall 316 of the first bending portion 3121 opposite to the top wall 315. The pressing member 33 is disposed on one end of the first connection section 311 away from the first bending portion 3121. The battery 34 is a long strip and accommodated in the first connection section 311, and the battery 34 is located between the pressing member 33 and the indicating member 35. The pressing member 33 is also disposed on the bottom wall 316 of the first connection section 311. The bottom wall 316 of the first connection section 311 is connected to the bottom wall 316 of the first bending portion 3121, so that a risk of the pressing member 33 being accidentally touched can be reduced.

Figure 6:
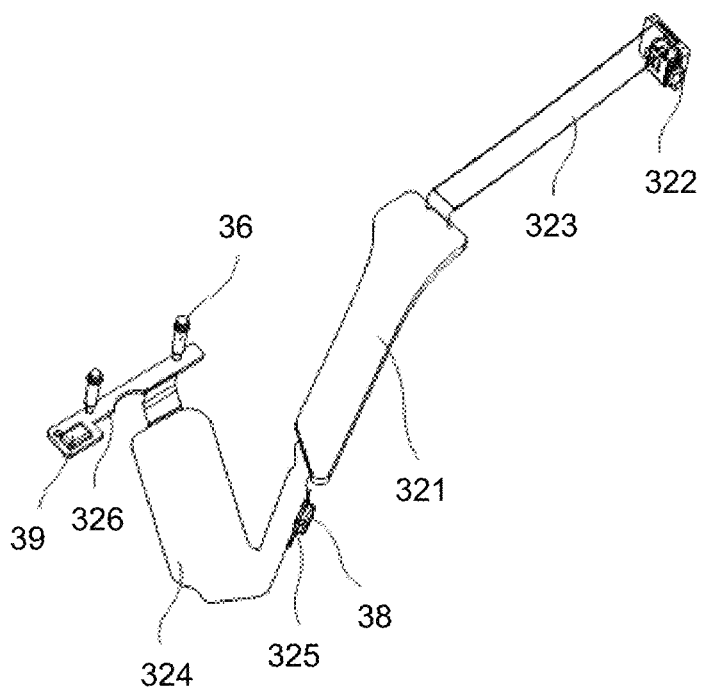
FIG. 6 is a schematic diagram illustrating an exemplary structure of a circuit board in the wearing member shown in FIG. 5.

Referring to FIG. 5 and FIG. 6 together, FIG. 6 is a schematic diagram illustrating an exemplary structure of a circuit board in the wearing member shown in FIG. 5.

The circuit board 32 includes a first hard board 321, a second hard board 322, and a first flexible board 323 disposed between the first hard board 321 and the second hard board 322. The first hard board 321 is disposed in the first bending portion 3121, the first flexible plate 323 is disposed in the first connection section 311, the battery 34 is stacked in layers with the first flexible board 323, and the second hard board 322 is disposed on one end of the battery 34 away from the first bending portion 3121. Both the indicating member 35 and the battery 34 are electrically connected to the first hard board 321, and the pressing member 33 is electrically connected to the second hard board 322.

That is, by setting the circuit board 32 as the first hard board 321, the second hard board 322, and the first flexible board 323, the first hard board 321 may be disposed to locate in the first bending portion 3121, and the second hard board 322 and the first flexible board 323 may be disposed to locate in the first connection section 311. Since the first flexible board 323 is flexible and thin, the first flexible board 323 may be conveniently disposed in the first connection section 311 and stacked in layers on one side of the battery 34, and the first flexible board 323 may cross the battery 34 to enable the second hard board 322 to be located at one end of the battery 34 away from the first hard board 321. Therefore, a space in an extending direction of the first connection section 311 may be used to install the second hard board 322, which can prevent the first connection section 311 from being too thick or too wide and fully utilize the space in the extending direction of the first connection section 311. Furthermore, the pressing member 33 is relatively close to the visual member 10, which is more convenient for the user to manipulate the visual member 10.

In some embodiments, the first hard board 321 is a long strip that matches with a shape of the first bending portion 3121 and is disposed in the first bending portion 3121. The indicating member 35 is electrically connected to one side of the first hard board 321. The battery 34 is a long strip that matches with a shape of the first connection section 311, and one end of the battery 34 is directly electrically connected to the first hard board 321. The first flexible board 323 is also a long strip that matches with the shape of the first connection section 311, which is stacked on one side of the battery 34 and crosses the battery 34 to extend to one end of the battery 34 away from the first hard board 321 and be electrically connected to the second hard board 322. The second hard board 322 is configured to electrically connect the pressing member 33. The pressing member 33 is determined to be supported rigidly based on operating feature(s) of the pressing member 33. The second hard board 322 is also pressed against the pressing member 33, providing a pressing force to the pressing member 33, which is convenient for the pressing member 33 to be pressed and triggered.

Further referring to FIG. 5 and FIG. 6, a main surface of the second hard board 322 is stacked on an end surface of the battery 34, so as to fully utilize a size of a cross section of the first connection section 311 to accommodate the second hard board 322. Therefore, a length dimension formed by the second hard board 322 and the battery 34 is relatively small, which can reduce a length requirement of the first connection section 311. Therefore, the first connection section 311 can accommodate the battery 34 with a relatively large length, so that a capacitance of the battery 34 can also be improved.

The main surface of the second hard board 322 is a surface of the second hard board 322 with a printed circuit or a surface opposite to the surface with the printed circuit. The main surface of the second hard board 322 is stacked on the end surface of the battery 34. In other words, a thickness dimension of the second hard plate 322 is stacked on the length dimension of the battery 34, and then a length dimension of the first connection section 311 required by the second hard board 322 can be reduced.

In this embodiment, the main surface of the second hard board 322 is approximately perpendicular to a main surface of the first flexible board 323, and the first flexible board 323 and the second hard board 322 are compactly disposed on two sides adjacent to the battery 34, which can use an installation space in the first connection section 311 relatively reasonably. In addition, by abutting against an inner wall of the first connection section 311, an installation stability of the first flexible board 323, the second hard board 322, and the battery 34 in the first connection section 311 can be improved.

In some embodiments, if an end of the battery 34 away from the first hard board 321 is a shaped surface, the main surface of the second hard board 322 is stacked on the shaped surface. For example, if the shaped surface is an inclined surface, the main surfaces of the second hard board 322 and the first flexible board 323 may also be disposed at an acute angle or an obtuse angle.

The wearing member 30 further includes a controller (not shown in the figures of the present disclosure). The controller is disposed in the first bending portion 3121, and electrically connected to and stacked in layers with the first hard board 321. The controller is configured to execute a corresponding function according to a triggering instruction of the pressing member 33, such as adjusting a volume, playing, pausing, etc., and can further control the indicating member 35 to flash or vibrate, so as to feedback the operation information of the pressing member 33 or to represent a state of the wearing member 30, such as a level of power. The controller may be further configured to distribute electrical energy to each of the multiple electronic devices in the housing 21 to activate a corresponding electronic device to operate.

In other words, the controller is disposed between the speaker 37 and the battery 34. The controller is also disposed between a nose bridge and an auricle of the user in the wearing state, which can further enhance the wearing stability of the wearable device 100.

The circuit board 32 further includes a second flexible board 324. The second flexible board 324 is connected to one side of the first hard board 321 away from the first flexible board 323, and is disposed in the second bending portion 3122. The wearing member 30 further includes the speaker 37. The speaker 37 is disposed in the second bending portion 3122, and is electrically connected to and stacked in layers with the second flexible board 324. The controller is further configured to control the speaker 37 to vibrate to generate a sound. A stacking direction between the controller and the first hard board 321, a stacking direction between the speaker 37 and the second flexible board 324, and a stacking direction between the battery 34 and the first flexible board 323 are the same, so that the circuit board 32, the battery 34, the controller, the speaker 37, and other electrical components may be assembled in the housing 31.

An external dimension of the speaker 37 is relatively large, so stacking the second flexible board 324 on one side of the speaker 37 by taking advantage of a feature being relatively thin of the second flexible board 324, which can facilitate the speaker 37 to be electrically connected to the second flexible board 324, and also reduce a requirement of an installation space inside the second bending portion 3122, thereby avoid bloating the second bending portion 3122.

The circuit board 32 further includes a third flexible board 325. The third flexible board 325 is connected to one side of the second flexible board 324, and is disposed to bend relative to the second flexible board 324. The wearing member 30 further includes the first sound pickup member 38. The first sound pickup member 38 is electrically connected to and stacked in layers with the third flexible board 325, and the first sound pickup member 38 is located between the controller and the speaker 37.

Further, referring to FIG. 3 to FIG. 6, the first hard board 321 is disposed in the first bending portion 3121 and forms an anti-bending support with the first bending portion 3121.

An overall structure of the wearing member 30 is roughly a shaped rod. The first bending portion 3121, the second bending portion 3122, and the first connection section 311 are hollow structures. A portion of the wearing member 30 with a hollow structure has a relatively weak structural strength and stiffness compared to a solid structure. The first bending portion 3121 is disposed between the second bending portion 3122 and the first connection section 311, so that a structural strength and stiffness of the first bending portion 3121 are relatively weak.

By disposing the first hard board 321 of the circuit board 32 in the first bending portion 3121 to form the anti-bending support with the first bending portion 3121, performance indicators (e.g., the structural strength and stiffness) of the first bending portion 3121 can be improved, which is beneficial to improving an anti-bending strength of the overall structure of the housing 31. That is, an anti-bending strength of the wearing member 30 can be improved.

In some embodiments, as shown in FIG. 4, the housing 31 includes the top wall 315, the bottom wall 316, a first side wall 317, and a second side wall 318, and the first side wall 317, the top wall 315, the top wall 318, and the top wall 316 froms the housing 31. In the wearing state, the first side wall 317 is attached to the user's head, the second side wall 318 faces away from the user's head, the top wall 315 is horizontally upward, and the bottom wall 316 is horizontally downward.

Referring to FIG. 4 and FIG. 5, the anti-bending support is formed between the first hard board 321 and the first bending portion 3121. As used herein, the anti-bending support may be that two side edges of the first hard board 321 abut against the first side wall 317 and the second side wall 318 of the first bending portion 3121, respectively, or the two sides of the first hard board 321 abut against the top wall 315 and the bottom wall 316 of the first bending portion 3121, respectively, or the first hard board 321 abut against at least one of the top wall 315, the bottom wall 316, a first side wall 317, or a second side wall 318, which can strengthen the first bending portion 3121.

In this embodiment, referring to FIG. 5 and FIG. 6, the first hard board 321 has a main surface. The main surface is disposed toward the first side wall 317 or the second side wall 318 of the first bending portion 3121. At least one side edge of the first hard board 321 adjacent to the main surface abuts against the top wall 315 or the bottom wall 316 of the first bending portion 3121.

As used herein, one side edge of the first hard board 321 adjacent to the main surface abuts against the top wall 315 or the bottom wall 316 of the first bending portion 3121. Alternatively, two side edges of the first hard board 321 adjacent to the main surface abut against the top wall 315 or the bottom wall 316 of the first bending portion 3121, respectively. Therefore, a section coefficient of the first bending portion 3121 can be increased, thereby improving the anti-bending strength of the first bending portion 3121.

Compared with the first bending portion 3121 that no structure abuts against the top wall 315, the bottom wall 316, the first side wall 317, or the second side wall 318 of the first bending portion 3121, by setting the first hard board 312 in the first bending portion 3121 and forming the anti-bending support between the first hard board 321 and the first bending portion 3121, the structural strength of the first bending portion 3121 can be improved.

Further, the first hard board 321 is configured to enhance the anti-bending strength of the first bending portion 3121 by at least 20%.

The controller is disposed in the first bending portion 3121 and is mounted on the main surface of the first hard board 321. Further, the controller and the first hard board 321 abut against the first side wall 317 and the second side wall 318 of the first bending portion 3121, respectively, which can further increase the anti-bending section coefficient of the first bending portion 3121. That is, the anti-bending strength of the first bending portion 3121 can be improved.

The speaker 37 is disposed in the second bending portion 3122, and further forms an anti-bending support to the second bending portion 3122. The battery 34 is disposed in the first connection section 311, and further forms an anti-bending support to the first connection section 311. Both the battery 34 and the speaker 37 are electrically connected to the first hard board 321.

Two sides of the battery 34 may abut against the top wall 315 and the bottom wall 316 of the first connection section 311, respectively, and/or two other sides of the battery 34 may abut against the first side wall 317 and the bottom wall 318 of the first connection section 311, respectively, to form the anti-bending support.

In some embodiments, the battery 34 may also be connected to the top wall 315, the bottom wall 316, the first side wall 317, and the second side wall 318 of the first connection section 311 through a fastener, welding, etc.

Two sides of the speaker 37 may abut against the top wall 315 and the bottom wall 316 of the second bending portion 3122, respectively, and/or two other sides of the speaker 37 may abut against the first side wall 317 and the second side wall 318 of the second bending portion 3122, respectively, to form the anti-bending support.

In some embodiments, the speaker 37 may also be connected to the top wall 315, the bottom wall 316, the first side wall 317, and the second side wall 318 of the second bending portion 3122 through a fastener, welding, etc.

In this embodiment, referring to FIG. 3 and FIG. 5, a first sound pickup hole 301 is disposed at the downward hollow 314 of the concave section 312. The first sound pickup member 38 picks up a sound through the first sound pickup hole 301, so as to utilize the downward hollow 314 to reduce a wind noise.

In this embodiment, the first sound pickup hole 301 is disposed at a bottom portion of the downward hollow 314. Since the bottom portion of the downward hollow 314 is least affected by the wind speed outside the downward hollow 314, so a sound input from the first sound pickup hole 301 disposed herein is least affected by wind noise.

When the user is in a condition of exercise such as riding or running, the wind speed outside the downward hollow 314 is relatively high, but an inside of the downward hollow 314 is less affected by an airflow outside the downward hollow 314 due to a shading of the concave section 312, so by setting the first sound pickup hole 301 at the downward hollow 314, the wind noise of the sound obtained initially by the first sound pickup hole 301 is relatively small, which is beneficial to improve the quality of the obtained sound.

In some embodiments, the first sound pickup hole 301 may also be disposed at a waist portion of the downward hollow 314.

In this embodiment, the first sound pickup member 38 is disposed at a corner junction between the first bending portion 3121 and the second bending portion 3122. In other words, the first sound pickup member 38 is disposed at a gap between the first hard board 321 and the speaker 37 to make full use of a space of the concave section 312, so that a distribution of the multiple electrical devices on the wearing member 30 is relatively reasonable, a layout is relatively compact, and a volume occupied by the multiple electrical devices is relatively small.

The controller is configured to convert a sound signal obtained by the first sound pickup member 38 into an electric signal, and control the speaker 37 to output the sound. A sound outlet hole is disposed at one end of the second bending portion 3122 facing the opening of the ear canal.

The wearing member 30 further includes a noise-reducing member 364. The noise-reducing member 364 is disposed in the first bending portion 3121. One end of a noise-reducing channel 303 of the noise-reducing member 364 is connected to the first sound pickup hole 301, and another end of the noise-reducing channel 303 is connected to the first sound pickup member 38. The the noise-reducing member 364 is located between the speaker 37 and the first hard board 321, and two ends of the noise-reducing member 364 abut against the top wall 315 and the bottom wall 316 of the first bending portion 3121, respectively, so as to further strengthen the anti-bending strength of the first bending portion 3121, and also strengthen an anti-bending strength of a junction of the first bending portion 3121 and the second bending portion 3122.

Figure 7:
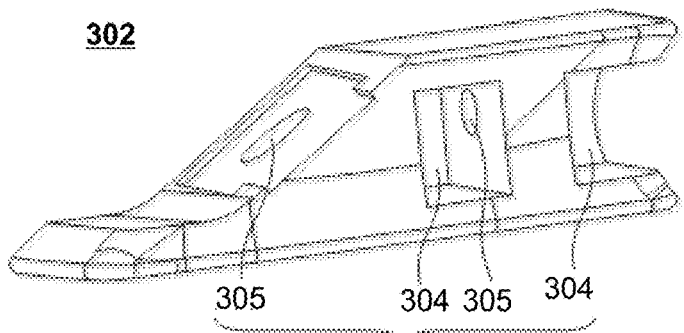
FIG. 7 is a schematic diagram illustrating an exemplary structure of a noise-reducing member in the wearing member shown in FIG. 5.

Referring to FIG. 7, FIG. 7 is a schematic diagram illustrating an exemplary structure of a noise-reducing member in the wearing member shown in FIG. 5.

The noise-reducing channel 303 includes a noise-reducing chamber 304 and a transmission channel 305 connecting the noise-reducing chamber 304. A size of a cross section of the noise-reducing chamber 304 perpendicular to an extension direction of the noise-reducing channel 303 is larger than a size of a cross section of the transmission channel 305. That is, when the sound is in a process of passing through the noise-reducing channel 303, after entering the noise-reducing chamber 304 through the transmission channel 305, the sound enters a larger space from a smaller space and energy of the sound may be reduced, thereby reducing the wind noise generated by a sound transmission and improving the quality of the sound picked up by the first sound pickup member 38.

As shown in FIG. 5, the second bending portion 3122 is further disposed with a positioning wall 3123. The positioning wall 3123 is located between the speaker 37 and the noise-reducing member 364 to limit a position of the noise-reducing member 364.

Further referring to FIG. 3 to FIG. 6, the circuit board 32 further includes a third hard board 326. The third hard board 326 is located in the second bending portion 3122, and the third hard board 326 is connected to one end of the second flexible board 324 away from the first hard board 321.

In some embodiments, the wearing member 30 further includes a second sound pickup member 39. The second sound pickup member 39 is electrically connected to and stacked in layers with the third hard board 326, and the second sound pickup member 39 is misaligned with the speaker 37. That is, the second sound pickup member 39 avoids the speaker 37 to avoid that installation positions of the second sound pickup member 39 and the speaker 37 overlap to cause the wearing member 30 to be too thick.

Therefore, the wearing member 30 can be minimized, which can reduce the size of the wearing member 30.

The concave section 312 also includes a second sound pickup hole 307. The second sound pickup member 39 is disposed in the concave section 312 and picks up the sound through the second sound pickup hole 307. An orientation of the second sound pickup hole 307 is different from an orientation of the first sound pickup hole 301, so as to obtain an environmental noise through the second sound pickup hole 307. And then, the environmental noise may be removed by performing an algorithm on the sounds obtained through the first sound pickup hole 301 and the second sound pickup hole 307.

In some embodiments, the second sound pickup hole 307 is disposed on one end of the second bending portion 3122 away from the first bending portion 3121. In the wearing state, the second sound pickup hole 307 faces a side opposite to the user's head, and the first sound pickup hole 301 faces upward toward the top of the user's head. Both the first sound pickup member 38 and the second sound pickup member 39 are electrically connected to the controller, and the controller may perform a noise reduction according to sound signals respectively obtained by the first sound pickup member 38 and the second sound pickup member 39 to eliminate the environmental noise. Therefore, the user can obtain a relatively good call quality and a voice control performance of the wearable device 100.

In some embodiments, the third hard board 326 also includes a charging member 36 for charging the battery 34.

In other words, the third hard board 326 may be connected to the second sound pickup member 39 and/or the charging member 36.

In some embodiments, the wearing member 30 includes the charging member 36 and at least one magnetic attachment member 308. Both the charging member 36 and the at least one magnetic attachment member 308 are disposed on a connection region between the second connection section 313 and the concave section 312. The at least one magnetic attachment member 308 is configured to magnetically attach a charger 200 that powers the charging member 36. The charging member 36 is electrically connected to the battery 34 and is configured to externally connect the charger 200 to charge the battery 34 in the housing 31.

As shown in FIG. 3 and FIG. 5, the connection region between the second connection section 313 and the concave section 312 is a corner structure formed by a connection between the second connection section 313 and the concave section 312. By disposing the charging member 36 and the at least one magnetic attachment member 308 in the corner structure, a small space in the housing 31 can be fully used to realize a charging function of the wearing member 30. A relatively regular and large space in the housing 31 may be configured to install the electronic devices with the relatively large size. Therefore, the electronic devices installed in the housing 31 can be distributed more reasonably and more compactly, which is conducive to minimizing the wearing member 30, thereby making the wearing member 30 closer to common glass temples or watch straps.

The wearing member 30 includes at least two magnetic attachment members 308. Directions of magnetic poles of at least two magnetic attachment members 308 are opposite to each other, so that the charger 200 needs to be combined with the wearing member 30 in a specific posture to make the at least two magnetic attachment member 308 magnetically attach the charger 200 and make the charger 200 electrically connected to the charging member 36. If a combined posture between the charger 200 and the wearing member 30 is incorrect, the at least two magnetic attachment members 308 may be magnetically repulsive to the charger 200, making the combination between the charger 200 and the wearing member 30 difficult. Therefore, mistake-proofing can be ensured to improve electrical connection efficiency between the charger 200 and the wearing member 30.

In some embodiments, the wearing member 30 includes at least two magnetic attachment members 308. The magnetic poles of the at least two magnetic attachment members 308 are distributed in a same manner, and the magnetic attachment members 308 only play the role of magnetic attachment.

Figure 8:
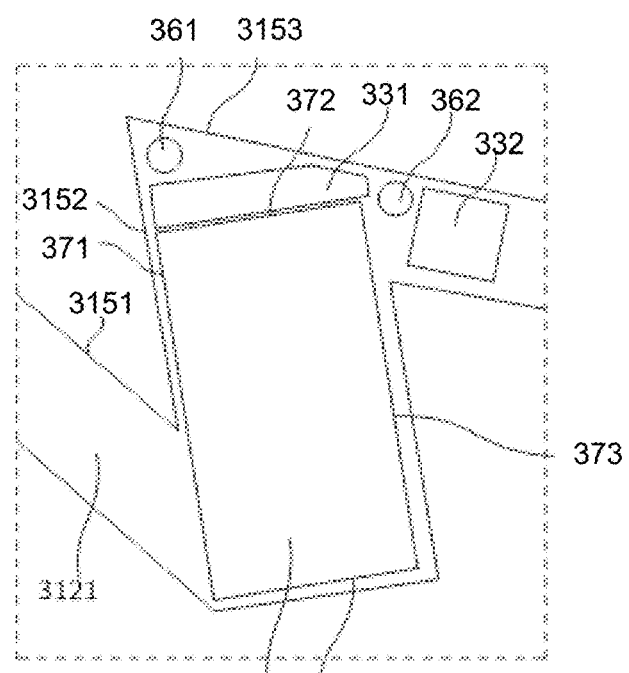
FIG. 8 is a schematic diagram illustrating an exemplary structure of a speaker, a charging member, and a magnetic attachment member assembled on a second bending portion in FIG. 3.

Referring to FIG. 3, FIG. 5, and FIG. 8 together, FIG. 8 is a schematic diagram illustrating an exemplary structure of the speaker, the charging member, and the at least one magnetic attachment member assembled in the second bending portion in FIG. 3. The speaker 37 is disposed in the second bending portion 3122, and the charging member 36 and the at least one magnetic attachment member 308 are located between an outer side wall of the speaker 37 and the top wall 315 of the connection region between the second connection section 313 and the concave section 312. That is, a remaining small space between the speaker 37 and the top wall 315 of the second bending portion 3122 is used to dispose the charging member 36 and the at least one magnetic attachment member 308, which can make full use of the space of the second bending portion 3122 and effectively improve a utilization rate of the space of the wearing member 30, making the electronic devices in the housing 31 more compact. Therefore, the wearing member 30 can be minimized, thereby making the wearing member 30 closer to temples of common glasses or watch straps.

As shown in FIG. 5 and FIG. 8, the speaker 37 is roughly a rectangular shape. The speaker 37 includes a first long-side wall 371, a first short-side wall 372, a second long-side wall 373, and a second short-side wall 374 connected in the rectangular shape. The top wall 315 includes a first top surface 3151, a second top surface 3152, and a third top surface 3153 sequentially connected through a bending connection. The first top surface 3151 is located on the first bending portion 3121, and the second top surface 3152 and the third top surface 3153 are located on the second bending portion 3122. The first top surface 3151 and the second top surface 3152 cooperate with each other to form the downward hollow 314. The first long-side wall 371 is disposed to be adjacent to the second top surface 3152, the first short-side wall 372 is disposed to be adjacent to the third top surface 3153, and at least a portion of the charging member 36 and the at least one magnetic attachment member 308 are located on a region defined by the second top surface 3152, the third top surface 3153, and the first short-side wall 372.

The second top surface 3152 and third top surface 3153 connected through the bending connection form a corner structure. The region defined by the second top surface 3152, the third top surface 3153, and the first short-side wall 372 roughly has the triangular shape. The at least portion of the charging member 36 and the at least one magnetic attachment member 308 are located in the triangular region, so as to make full use of the small space in the second bending portion 3122, thereby making the overall structure of the wearing member 30 compact and minimizing the size of the wearing member 30.

Furthermore, the corner structure is further configured to position the charger 200. By positioning the charger 200 with a unique shape and structure of the corner structure, the charger 200 can be better aligned for charging.

As shown in FIG. 8, a portion of the charging member 36 and the at least one magnetic attachment member 308 are located on one side of the second long-side wall 373 away from the first long-side wall 371, so as to make full use of a space of one side of the speaker 37 toward the second connection section 313 to accommodate the portion of the charging member 36 and the at least one magnetic attachment member 308.

In this embodiment, the at least one magnetic attachment member 308 includes a first magnet 331 and a second magnet 332, and the charging member 36 includes a first charging electrode 361 and a second charging electrode 362. The first charging electrode 361, the first magnet 331, and the speaker 37 are distributed along the second top surface 3152, and the first charging electrode 361, the first magnet 331, the second charging electrode 362, and the second magnet 332 are further distributed along the third top surface 3153, so as to make full use of a vertical dimension of the second top surface 3152 and the third top surface 3153.

The first charging electrode 361 and the second charging electrode 362 form a thimble structure. In order to have a relatively good magnetic attachment force to the charger 200, the first magnet 331 and the second magnet 332 are relatively large in volume and have a shaped structure. The shaped structure of the first magnet 331 and the second magnet 332 is configured to make the first magnet 331 and the second magnet 332 adapt to a remaining corner space in the second bending portion 3122, thereby improving the utilization rate of the space in the second bending portion 3122.

Further, the first charging electrode 361 is disposed in a region defined by the second top surface 3152, the third top surface 3153, and the first magnet 331, and the second charging electrode 362 is located in a region enclosed by the first magnet 331, the second magnet 332, the speaker 37, and the third top surface 3153.

Figure 9:
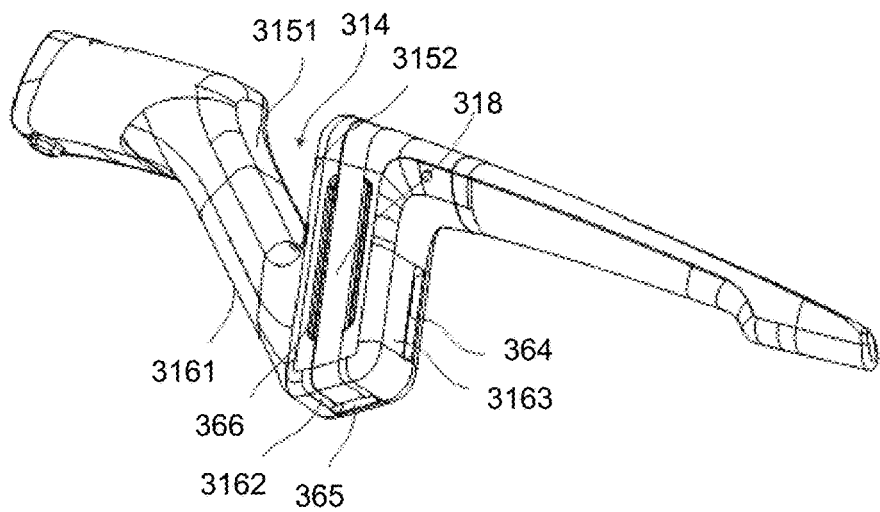
FIG. 9 is a schematic diagram illustrating a further exemplary axial structure of the wearing member shown in FIG. 3.
Figure 10:
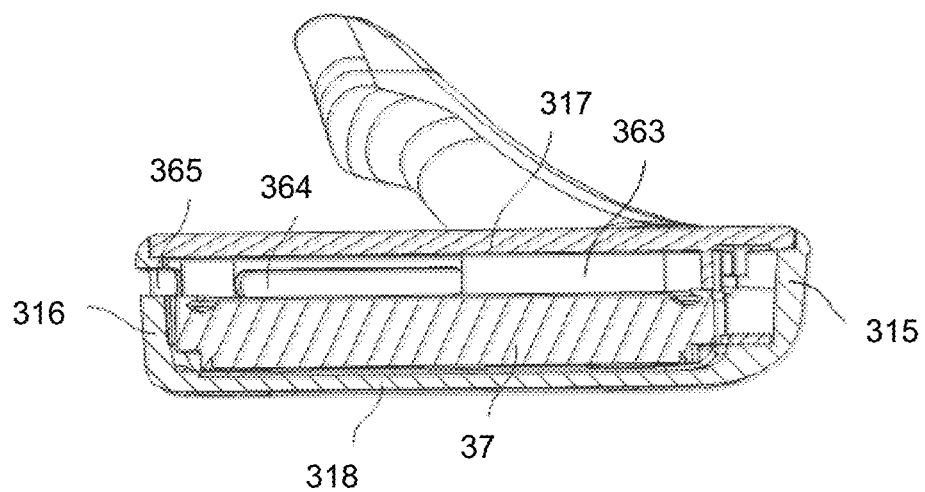
FIG. 10 is a schematic diagram illustrating an exemplary sectional structure of the wearing member shown in FIG. 3.

Referring to FIG. 3, FIG. 9, and FIG. 10 together, FIG. 9 is a schematic diagram illustrating another exemplary axial structure of the wearing member shown in FIG. 3, and FIG. 10 is a schematic diagram illustrating an exemplary sectional structure of the wearing member shown in FIG. 3.

The bottom wall 316 includes a first bottom surface 3161, a second bottom surface 3162, and a third bottom surface 3163 sequentially connected through a bending connection.

A resonant chamber 363 is formed between the speaker 37 and the first side wall 317 of the second bending portion 3122, and the second bending portion 3122 also includes a sound-out hole 365 in communication with the resonant chamber 363. The second side wall 318 of the second bending portion 3122 includes a muffling hole 366, and the speaker 37 is attached to the second side wall 318 and covers the muffling hole 366.

In some embodiments, the sound-out hole 365 is disposed on the second bottom surface 3162, and the muffling hole 366 cooperates with the sound-out hole 365 to form a dipole. The muffling hole 366 and the sound-out hole 365 are located on different sides of the speaker 37. In the wearing state, distances from the muffling hole 366 and the sound-out hole 365 to the opening of the user's ear canal are also different. If sounds output by the muffling hole 366 and the sound-out hole 365 meet a certain condition (e.g., a phase difference is about 180 degrees), dipole-like radiations may be formed. In a far field, the sounds output by the muffling hole 366 and the sound-out hole 365 may be reversed to eliminate, thereby reducing a volume of sound leakage of the speaker 37 in the far field and preventing the sound output by the speaker 37 from being heard by people nearby, which can improve the privacy of the wearing member 30.

Further, the third bottom surface 3163 also includes a sound-tuning hole 364. The sound-tuning hole 364 is connected to the resonant chamber 363. The sound-tuning hole 364 is configured to equivalently shorten a chamber length of the resonant chamber 363 to increase a resonance frequency of the resonant chamber 363, which can make a frequency response curve generated by the speaker 37 be as flat as possible, thereby avoiding resonance of the resonant chamber 363 resulting in discomfort to the user when the wearing member 30 is worn.

As shown in FIG. 5, the wearing member 30 further includes a flexible cover 306. The flexible cover 306 is sleeved on the second connection section 313. The second connection section 313 gradually bends along an extending direction of the second connection section 313, such that the second connection section 313 is clamped to the user's head in the wearing state. Therefore, the flexible cover 306 is also clamped to the user's head and elastically contacts with the user's head with relatively little pressure, improving the comfort of the user in the wearing state. In addition, the flexible cover 306 may further provide a relatively large friction, increasing the wearing stability of the wearable device 100.

Figure 11:
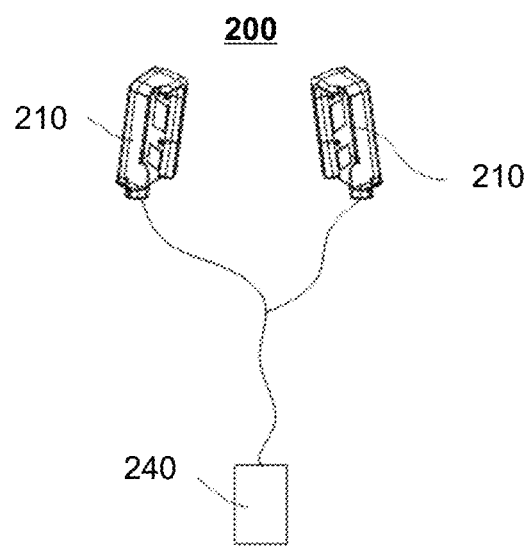
FIG. 11 is a schematic diagram illustrating an exemplary structure of a charger according to some embodiments of the present disclosure.
Figure 12:
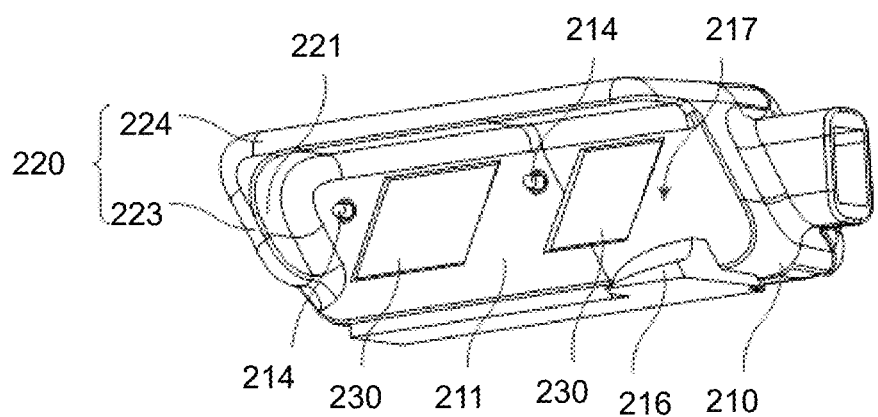
FIG. 12 is a schematic diagram illustrating an exemplary structure of a seat body, a limiting member, and a magnetic member assembled in the charger shown in FIG. 11.

The present disclosure further provides the charger 200. Referring to FIG. 11 and FIG. 12 together, FIG. 11 is a schematic diagram illustrating an exemplary structure of a charger according to some embodiments of the present disclosure. FIG. 12 is a schematic diagram illustrating an exemplary structure of a seat body, a limiting member, and a magnetic member assembled in the charger shown in FIG. 11.

The charger 200 includes at least one seat body 210, at least one limiting member 220, and at least one magnetic member 230. The at least one seat body 210 is disposed with a joining surface 211. The at least one limiting member 220 is disposed on the at least one seat body 210. The at least one magnetic member 230 is disposed on the at least one seat body 210 to magnetically cooperate with the at least one magnetic attachment member 308 on the wearing member 30. A magnetic attachment force between the at least one magnetic member 230 and the at least one magnetic attachment member 308 has a first component that enables the wearing member 30 to attach to the joining surface 211 and a second component that enables the wearing member 30 to form a limit with the limiting member 220.

In other words, when the charger 200 is docked with the wearing member 30, the magnetic attachment force of mutual traction is generated between the at least one magnetic member 230 and the at least one magnetic attachment member 308. The magnetic attachment force is a vector, which can be decomposed into the first component and the second component. The first component may pull the wearing member 30 to attach to the joining surface 211, and the second component may pull the wearing member 30 to form a limiting relationship with the at least one limiting member 220, so that the user only needs to roughly align charging positions of the charger 200 and the wearing member 30. That is, under a magnetic cooperation between the at least one magnetic member 230 and the at least one magnetic attachment member 308, the charger 200 and the wearing member 30 can be adaptively docked, which is convenient for the user to use the charger 200 for charging.

In this embodiment, after the charger 200 and the wearing member 30 are docked, a geometric center of the at least one magnetic member 230 may be misaligned with a geometric center of a corresponding magnetic attachment member 308. Moreover, in some embodiments, a distance between the geometric center of the at least one magnetic member 230 and the limiting member 220 is smaller than a distance between the geometric center of the corresponding magnetic attachment member 308 and the top wall 315. Under an unobstructed condition, the geometric center of the at least one magnetic member 230 and the geometric center of the magnetic attachment member 308 tend to be aligned with each other, and then when the charger 200 is docked with the wearing member 30, the magnetic attachment force between the at least one magnetic member 230 and the magnetic attachment member 308 may further lead to the second component that enables the top wall 315 and the at least one limiting member 220 to form the limiting relationship.

In this embodiment, as shown in FIG. 12, the at least one limiting member 220 is a semi-enclosed blocking wall, which is disposed on an edge of the at least one seat body 210. The second component is disposed to abut the wearing member 30 against the blocking wall to form a limit fit. The blocking wall has a stop surface 221 perpendicular to the joining surface 211, and the second component is configured to abut the wearing member 30 against the stop surface 221.

In some embodiments, the blocking wall includes a first sub-wall 223 and a second sub-wall 224 disposed at an angle, and the first sub-wall 223 and the second sub-wall 224 are configured to form the limit fit with the corner structure of the wearing member 30.

In some embodiments, the at least one limiting member 220 may also be disposed as a protrusion or a groove on the joining surface 211 of the at least one seat body 210, and the protrusion or groove is configured to position the wearing member 30. The wearing member 30 includes a groove matching the protrusion. Alternatively, the wearing member 30 includes a protrusion matching the groove.

In this embodiment, the at least one magnetic member 230 includes at least two magnetic members 230. Directions of magnetic poles of the at least two magnetic members 230 are opposite to each other. Therefore, mistake-proofing can be ensured to avoid an inaccurate charging posture between the charger 200 and the at least one wearing member 30, thereby improving electrical connection efficiency between the charger 200 and the at least one wearing member 30.

Figure 13:
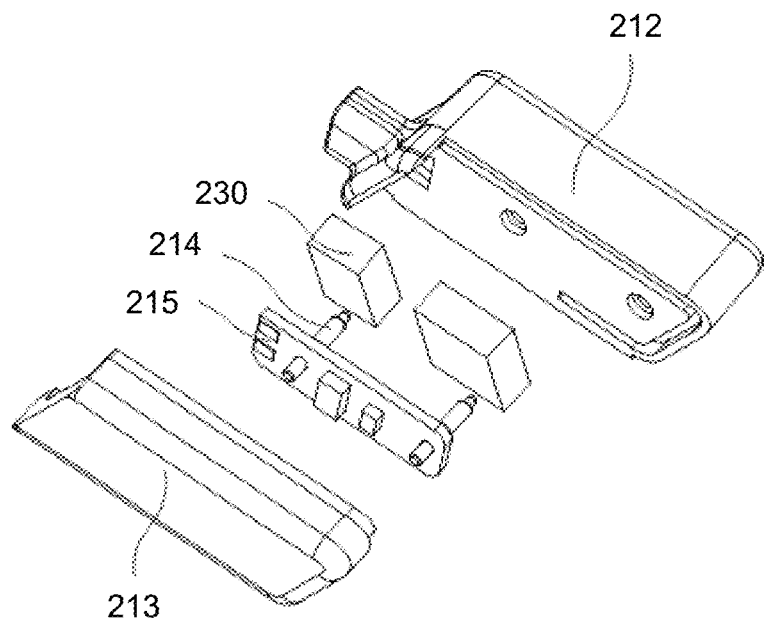
FIG. 13 is a schematic diagram illustrating an exemplary decomposed structure of the seat body, the limiting member, and the magnetic member shown in FIG. 12.

FIG. 13 is a schematic diagram illustrating an exemplary decomposed structure of the at least one seat body, the at least one limiting member, and the at least one magnetic member assembled in the charger 200 shown in FIG. 12.

The at least one seat body 210 includes a main body 212, a cover body 213, a power connection member 214, and a power supply board 215. The magnetic member 230 and the power supply board 215 are stacked in layers and are located in an accommodation space formed by interlocking the main body 212 on the cover body 213. The power connection member 214 is electrically connected to the power supply board 215 and exposed from a mounting hole on the main body 212 for electrically connecting the charging member 36 of the at least one wearing member 30.

As shown in FIG. 12, the at least one seat body 210 also includes a clamping wall 216. The clamping wall 216 cooperates with the limiting member 220 to form a clamping interface 217 to clamp the at least one wearing member 30, so as to further enhance a connection firmness between the charger 200 and the at least one wearing member 30, thereby improving a charging stability.

As shown in FIG. 11, the charger 200 further includes a power connector 240. The at least one seat body 210 includes two seat bodies 210. Each of the two seat bodies 210 includes a limiting member 220 and a corresponding magnetic member 230. The power connector 240 is electrically connected to the power supply boards 215 of the two seat bodies 210 through a wire, so that the two seat bodies 210 can charge the two wearing members 30 of the wearable device 100, respectively.

Figure 14:
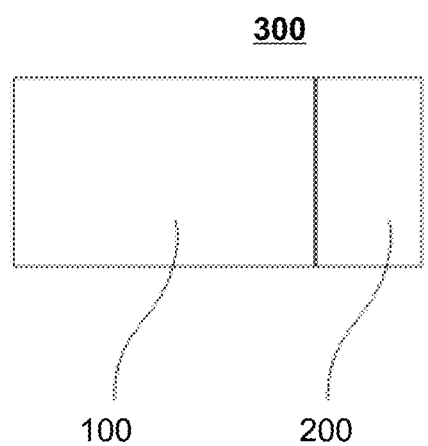
FIG. 14 is a schematic diagram illustrating an exemplary structure of a charging system according to some embodiments of the present disclosure.

The present disclosure further provides a charging system 300. Referring to FIG. 14, FIG. 14 is a schematic diagram illustrating an exemplary structure of a charging system according to some embodiments of the present disclosure. The charging system 300 includes the wearable device 100 and the charger 200. The charger 200 is configured to charge the battery 34 in the wearable device 30 of the wearable device 100, which is not repeated herein.

Different from a situation in the prior art, the present disclosure discloses a wearing member, a wearable device, and a charging system. By defining that the housing of the wearing member includes the first connection section and the concave section, the concave section forms the downward hollow, and at least a portion of the one or more electronic devices are disposed in the concave section, the one or more electronic devices can be installed in the concave section, further making full use of an installation space in the wearing member and optimizing a layout of the one or more electronic devices, which minimizes the wearing member and improves the utilization rate of space.

The above is only the implementation mode of the present disclosure and does not limit the scope of patents of the present disclosure. Any equivalent structure or equivalent process transformation made by using the description of the present disclosure and the contents of the accompanying drawings, or directly or indirectly used in other related technical fields are all included in the scope of patent protection of the present disclosure in the same way.

What is claimed is:

1. A wearing member, comprising:
   a housing, including a first connection section and a concave section, the concave section being connected to one end of the first connection section, wherein the concave section forms a downward hollow in a wearing state; and
   one or more electronic devices, at least a portion of the one or more electronic devices being disposed in the concave section, wherein
   the concave section includes a first bending portion and a second bending portion, top walls of the first bending portion and the second bending portion forming the downward hollow in the wearing state, and the first connection section being connected to the first bending portion; and
   the one or more electronic devices include a circuit board, the circuit board including a first hard board, and the first hard board being disposed in the first bending portion to form an anti-bending support with the first bending portion.

2. The wearing member of claim 1, wherein the first hard board has a main surface, the main surface being disposed opposite to a side wall of the first bending portion, and at least one side edge on the first hard board adjacent to the main surface abutting against the top wall or a bottom wall of the first bending portion.

3. The wearing member of claim 2, wherein the wearing member further includes a controller, the controller being disposed in the first bending portion and mounted on the main surface, and the controller and the first hard board abutting against a first side wall and a second side wall of the first bending portion, respectively.

4. The wearing member of claim 1, wherein the wearing member further includes a battery and a speaker, wherein
the speaker is disposed in the second bending portion to form an anti-bending support to the second bending portion;
the battery is disposed in the first connection section to form an anti-bending support to the first connection section; and
both the battery and the speaker are electrically connected to the first hard board.

5. The wearing member of claim 4, wherein a sound pickup hole is disposed at a bottom portion of the downward hollow, and the wearing member further includes a noise-reducing member and a sound pickup member, wherein
the noise-reducing member is disposed in the first bending portion, one end of a noise-reducing channel of the noise-reducing member is in communication with the sound pickup hole, and another end of the noise-reducing channel is in communication with the sound pickup member, and
the noise-reducing member is located between the speaker and the first hard board, and two ends of the noise-reducing member abut against the top wall and a bottom wall of the first bending portion, respectively.

6. The wearing member of claim 1, wherein the housing further includes a second connection section connected to the second bending portion, each of the first connection section and the second connection section extending to a side apart from each other; and
the wearing member further includes a flexible cover, the flexible cover being sleeved on the second connection section, wherein the second connection section gradually bends along an extending direction of the second connection section, such that the second connection section is clamped to a user's head in the wearing state.

7. The wearing member of claim 1, wherein the housing further includes a second connection section, the first connection section and the second connection section being connected to opposite sides of the concave section, respectively;
the one or more electronic devices include a speaker, the speaker being disposed in the concave section; and
the wearing member further includes a battery, the battery being disposed in the first connection section and configured to supply power to the speaker; wherein
one end of the first connection section far away from the second connection section is configured to connect to a visual member, the visual member is configured to be worn on a nose bridge, and the second connection section is configured to be worn on an auricle.

8. The wearing member of claim 7, wherein the first bending portion and the second bending portion are connected through a bending connection, the first connection section being connected to one end of the first bending portion away from the second bending portion, and the second connection section being connected to one end of the second bending portion away from the first bending portion, wherein the speaker is disposed in the second bending portion.

9. The wearing member of claim 8, wherein the wearing member further includes a controller, wherein the controller is disposed in the first bending portion, and the controller is electrically connected to the battery and the speaker.

10. The wearing member of claim 9, wherein the circuit board is disposed in the first connection section and the concave section, and the speaker, the battery, and the controller are electrically connected to the circuit board.

11. The wearing member of claim 10, wherein the wearing member further includes a pressing member and an indicating member, wherein
the pressing member is disposed in the first connection section and electrically connected to the circuit board;
the indicating member is disposed in the concave section and electrically connected to the circuit board, the indicating member being configured to feedback operation information of the pressing member; and
the battery is located between the pressing member and the indicating member.

12. The wearing member of claim 1, wherein the circuit board is disposed inside the housing, and the wearing member further comprises:
a pressing member, disposed on the first connection section and electrically connected to the circuit board;
a battery, disposed in the first connection section and electrically connected to the circuit board; and
the one or more electronic devices include an indicating member, wherein the indicating member is disposed in the concave section and electrically connected to the circuit board, and the battery is located between the pressing member and the indicating member.

13. The wearing member of claim 1, wherein:
the housing further includes a second connection section, the first connection section and the second connection section being connected to both ends of the concave section, respectively, and extending in opposite directions; and
the one or more electronic devices include a charging member, and the wearing member further includes at least one magnetic attachment member, wherein the charging member and the at least one magnetic attachment member are located on a connection region between the second connection section and the concave section, and the at least one magnetic attachment member is configured to magnetically attach a charger that supplies power to the charging member.

14. The wearing member of claim 13, wherein the at least one magnetic attachment member of the wearing member includes at least two magnetic attachment members, and directions of magnetic poles of the at least two magnetic attachment members are opposite to each other.

15. The wearing member of claim 13, wherein the first connection section extends to a side away from the second bending portion, and the second connection section is connected to the second bending portion and extends to a side away from the first bending portion; and
the wearing member further includes a speaker, the speaker being disposed in the second bending portion, and the charging member and the one or more magnetic attachment members being located between an outer side wall of the speaker and the top wall of the second bending portion.

16. The wearing member of claim 15, wherein the speaker includes a first long-side wall, a first short-side wall, a second long-side wall, and a second short-side wall that are connected in a rectangular shape, and the top wall includes a first top surface, a second top surface, and a third top surface that are sequentially connected through a bending connection, the first top surface being located on the first bending portion, the second top surface being located on the second bending portion, and the first top surface and the second top surface cooperating with each other to form the downward hollow; wherein the first long-side wall is adjacent to the second top surface, the first short-side wall is adjacent to the third top surface, and at least a portion of the charging member and the one or more magnetic attachment members are located in a region defined by the second top surface, the third top surface, and the first short-side wall.

17. The wearing member of claim 16, wherein a portion of the charging member and the one or more magnetic attachment members are located on one side of the second long-side wall away from the first long-side wall.

18. The wearing member of claim 17, wherein a resonant chamber is formed between the speaker and a first side wall of the second bending portion,
- a sound-out hole in communication with the resonant chamber is disposed in the second bending portion,
- a muffling hole is disposed on a second side wall of the second bending portion,
- the speaker is attached to the second side wall to cover the muffling hole, and
- the muffling hole cooperates with the sound-out hole to form a dipole.

19. A wearable device, wherein the wearable device includes a visual member and a wearing member, and the wearing member is connected to the visual member, wherein the wearing member includes:
- a housing, including a first connection section and a concave section, the concave section being connected to one end of the first connection section, wherein the concave section forms a downward hollow in a wearing state; and
- one or more electronic devices, at least a portion of the one or more electronic devices being disposed in the concave section, wherein
  - the concave section includes a first bending portion and a second bending portion, top walls of the first bending portion and the second bending portion forming the downward hollow in the wearing state, and the first connection section being connected to the first bending portion; and
  - the one or more electronic devices include a circuit board, the circuit board including a first hard board, and the first hard board being disposed in the first bending portion to form an anti-bending support with the first bending portion.

\* \* \* \* \*